United States Patent [19]

Major

[11] Patent Number: 5,408,537
[45] Date of Patent: Apr. 18, 1995

[54] MOUNTED CONNECTOR PIN TEST USING IMAGE PROCESSING

[75] Inventor: Kevin M. Major, Sandown, N.H.

[73] Assignee: AT&T Corp., Murray Hill, N.J.

[21] Appl. No.: 156,153

[22] Filed: Nov. 22, 1993

[51] Int. Cl.⁶ .......................... G06K 9/00; H04N 7/00
[52] U.S. Cl. .......................................... 382/8; 348/86
[58] Field of Search .................. 382/8, 16, 19, 23, 25, 382/26, 28; 348/86, 87, 91

[56] References Cited

U.S. PATENT DOCUMENTS

| | | | |
|---|---|---|---|
| 4,696,047 | 9/1987 | Christian et al. | 382/8 |
| 4,821,157 | 4/1989 | Birk et al. | 382/8 |
| 4,851,902 | 7/1989 | Tezuka et al. | 358/101 |
| 4,928,169 | 5/1990 | leberl et al. | 382/8 |
| 5,007,097 | 4/1991 | Mizuoka et al. | 382/8 |
| 5,121,438 | 6/1992 | Kawauchi et al. | 382/8 |
| 5,185,811 | 2/1993 | Beers et al. | 328/8 |
| 5,249,035 | 9/1993 | Yamanaka | 382/8 |

Primary Examiner—Joseph Mancuso
Assistant Examiner—Gerard Del Rosso

[57] ABSTRACT

A digital image of the connector pins and their mounting surface background is produced from a direction parallel to the pins by a ccd camera with a telocentric lens and a fiber optic ring light. The image is filtered, binarized and blob analyzed by computer to find rows of blobs that represent rows of pins. The attributes and spacing of the pin blobs are then compared against predetermined criteria to determine pin failures.

14 Claims, 7 Drawing Sheets

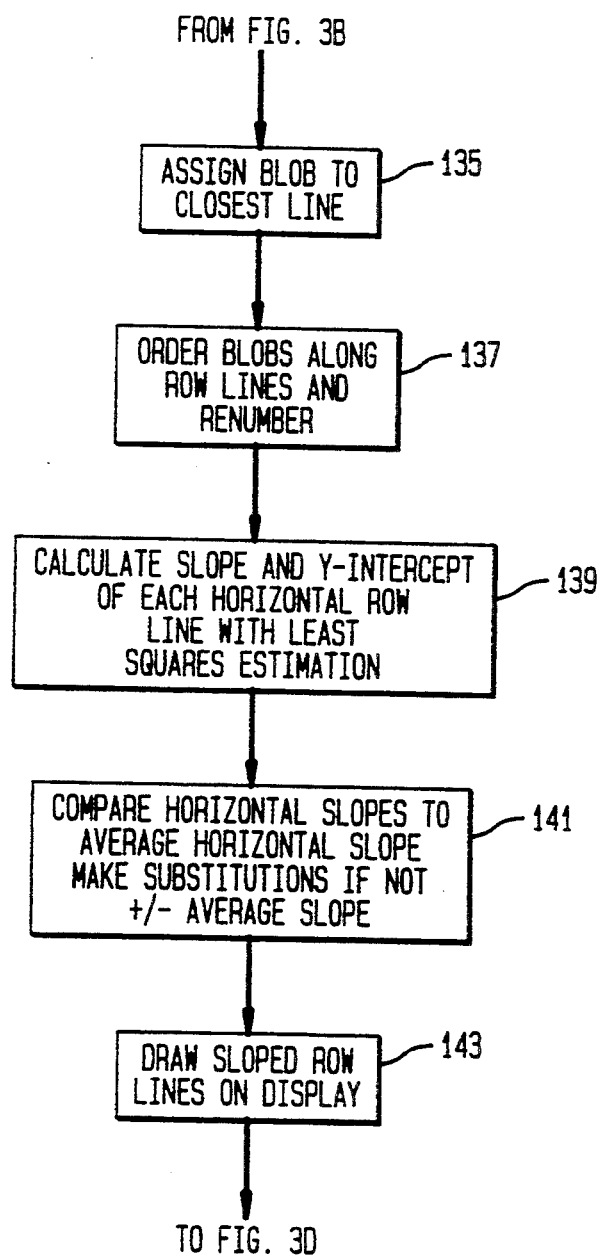

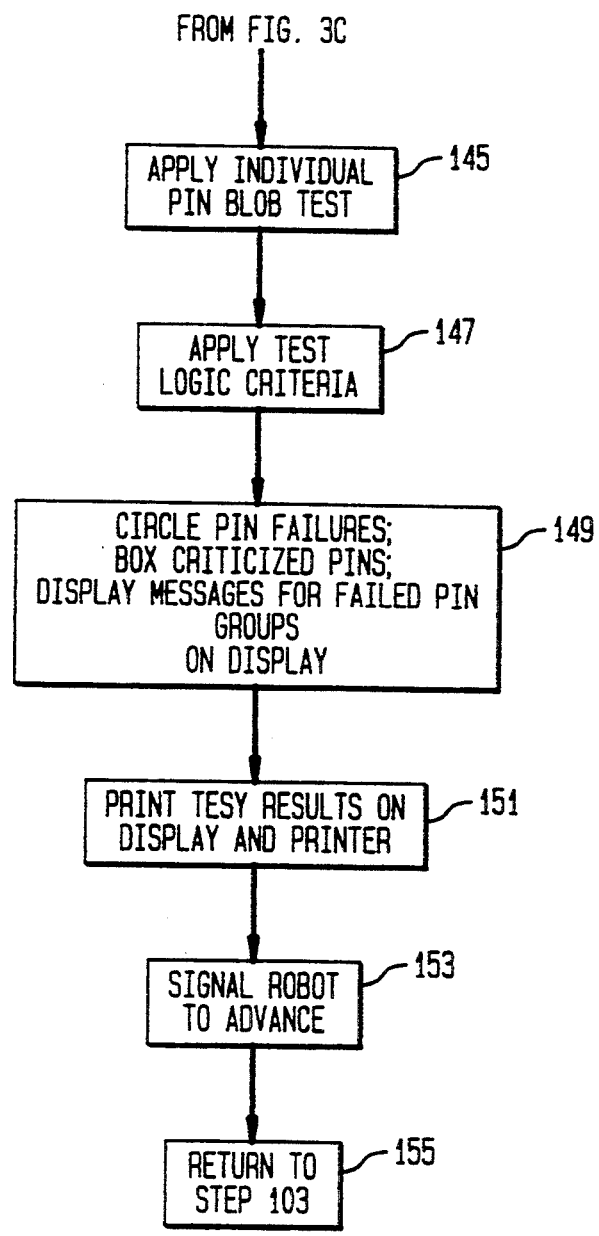

FIG. 4

TABLE 1

| BLOB TESTING ||
|---|---|
| SYMBOL | DESCRIPTION OF TEST |
| a | BLOB BOX INTERSECTS ROW LINE |
| b | BLOB AREA/BOX AREA >= 65% |
| c | X MAX DIMENSION |
| d | X MIN DIMENSION |
| e | Y MAX DIMENSION |
| f | Y MIN DIMENSION |
| g | X LEFT-SIDE SEPARATION |
| h | X RIGHT-SIDE SEPARATION |
| j | ASPECT RATIO |
| p | Y-CENTROID +/-2 PIXELS OF ROW LINE |
| r | Y-UPWARD SEPARATION |
| s | Y-DOWNWARD SEPARATION |

TABLE 2

| BLOB FAIL CONDITIONS (LOGIC 1 = TEST FAILED) ||
|---|---|
| LOGICAL CONDITION | DESCRIPTION |
| a | BLOB OFF OF HORIZONTAL ROW LINE |
| b | BAD AREA TO BOX RATIO |
| c ∪ e | X AND Y DIMENSIONS TOO BIG |
| g ∪ h | LEFT AND RIGHT SEPARATION PROBLEMS |
| (g ∩ h) ∪ c | X TOO BIG AND A HORIZONTAL SEPARATION PROBLEM |
| (d ∩ f) ∪ p | DIMENSION TOO SMALL AND Y-CENTROID NOT CLOSE TO ROW LINE |
| (d ∩ f) ∪ (g ∩ h ∩ r ∩ s) | DIMENSION TOO SMALL AND HORIZ. OR VERT. SEPAR. PROBLEM |
| (c ∩ d ∩ e ∩ f) ∪ j | DIMENSION PROBLEM AND ASPECT RATIO BAD |
| (r ∪ s) ∪ (g ∩ h) | HORIZONTAL AND VERTICAL SEPARATION PROBLEM |

TABLE 3

| BLOB WARNING CONDITIONS (LOGIC 1 = TEST FAILED) ||
|---|---|
| LOGICAL CONDITION | DESCRIPTION |
| (g ∩ h ∩ r ∩ s) | HORIZONTAL AND VERTICAL SEPARATION PROBLEM |
| c ∪ ALL ELSE PASS | X MAX DIMENSION ONLY THING WRONG |
| e ∪ ALL ELSE PASS | Y MAX DIMENSION ONLY THING WRONG |

TABLE 4

| PIN GROUP TESTING (ENTIRE PIN GROUP EVALUATED) |
|---|
| PIN ROW VERTICAL SEPARATION TEST |
| COUNT NUMBER OF PINS IN ROW TEST |

MOUNTED CONNECTOR PIN TEST USING IMAGE PROCESSING

BACKGROUND OF THE INVENTION

Bends or other irregularities in back plane pins present a serious problem in the manufacture of electronic apparatus. With current circuit pack connector technology, the number of individual electrical connections between a circuit card and the equipment back plane can number over one thousand. Typically, the connections are made between pins on the back plane spaced on 100 mil grids and matching female connectors on the circuit card edge, by the equipment user inserting the card into the appropriate slot in the equipment. Even a single pin that is bent or out of place can cause not only equipment malfunction, but also circuit destruction and customer dissatisfaction.

Inspection of the back plane for such pin irregularities is not a simple task. The pins in an individual connector are typically surrounded by a shroud, and many such connectors are mounted within a card cage. Inspection of mounted connectors, therefore, must be made from a direction parallel to the pins, and, if by humans, from several inches away from the pins. Experience has shown that such human inspection is slow, and therefore costly, requires considerable training, and yet is not very reliable.

While automated visual inspection systems for components are known, none has the ability to solve the problem addressed by this invention. U.S. Pat. No. 4,851,902, that issued Jul. 25, 1989 to Tezuka et al. discloses a system for inspecting integrated circuit lead frames. The inspection method requires precise positioning of the lead frame under test in order to align the camera image with a reference image. Positioning precise enough to detect slightly bent pins with this method would be very time consuming and defeat the advantage of automation.

U.S. Pat. No. 5,185,811, that issued Feb. 9, 1993 to Beers et al. discloses a system for observation of surface mount component leads to determine the component orientation for automated component placement. The disclosed method uses pixel summation profiles to locate leads, which show up as a substantial line of lit pixels. The method is not applicable to analyze a field of pins viewed end-on.

There is therefore a need for an inspection system for pins within shrouds mounted in card cages that is reliable, fast and inexpensive to operate. Furthermore, there is a need for an automated system in which data characterizing failed units can be easily gathered for analysis and correction.

SUMMARY OF THE INVENTION

The method tests pins that are arranged in rows and project from a mounting surface by entering into memory a binary image of at least a portion of the mounting surface and the pin rows viewed from a direction approximately parallel to the pins. In a blob encoding step, contiguous pixels of one of the two binary brightness values in the binary image are associated into identified blobs, and a predetermined set of descriptive attributes is computed for each identified blob. From the blob attributes, the location of at least one row of blobs that represents a row of pins is determined; blobs that lie in the located row are selected as pin blobs, and the spacing between adjacent selected blobs is calculated. Finally, predetermined criteria are applied to the computed attributes and the calculated spacing of the pin blobs to identify failed pins in the row. More than one blob row can be located, and the spacing calculated between adjacent pin blobs in different rows. Besides computer means to perform the image processing, the apparatus of the invention comprises illuminating means for illuminating the pins and the mounting surface, a camera for producing the image, and memory means for temporarily storing the image. It may also include a robotic positioner for rapidly and accurately repositioning the camera to produce new images for analysis to test all the pin shrouds in a card cage.

BRIEF DESCRIPTION OF THE DRAWING

FIGS. 3A–3D are a flow chart that describes an embodiment of the method of the invention.

FIG. 4 is a set of tables describing test and decision criteria useful in implementing the invention.

DETAILED DESCRIPTION

Figure 1:
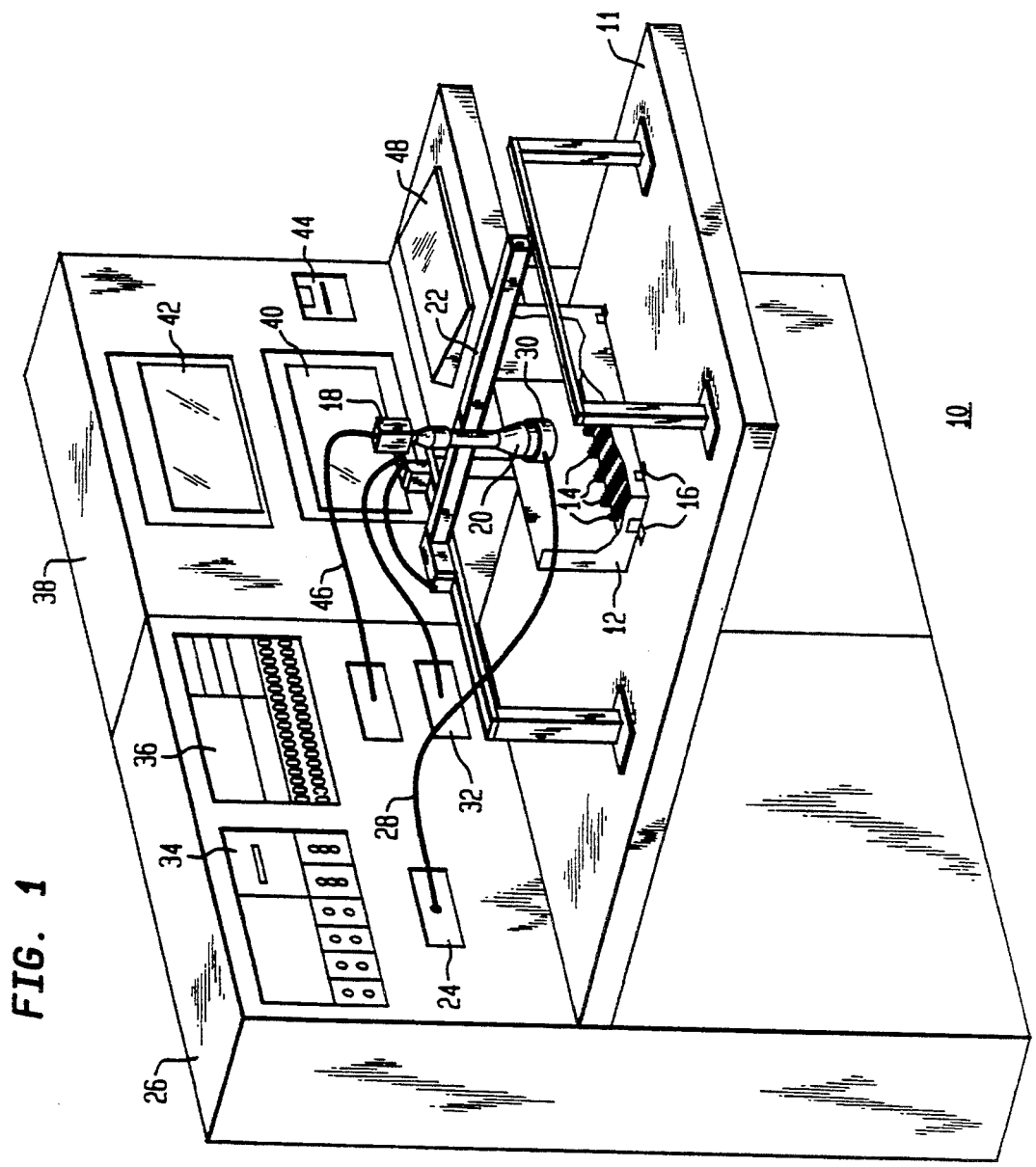
FIG. 1 is an isometric drawing of a test station embodying the invention.

A configuration of apparatus according to the invention that is suitable for the production testing of card cages is shown in FIG. 1. A test station 10 has a bench platform 11 upon which rests a card cage 12 that contains rows of pins 14 for testing. A set of positioning jigs 16 mounted on platform 11 assists in locating successive card cages in a repeatable position. A charge coupled device (CCD) video camera 18, to which may be attached a lens system 20, may be positioned over card cage 12 by a robotic positioner 22, also mounted on platform 11. A light source 24, housed in a cabinet 26, which is attached to platform 11, may be used to illuminate card cage 12 via a fiber optic cable 28 and a ring light 30 attached to lens system 20. Also housed in cabinet 26 may be the controls 32 for robotic positioner 22, a digital image processor 34 and a central processing unit (CPU) 36. Another attached cabinet 38 may house a CPU monitor 40, a test image monitor 42 and a printer 44. A multi-conductor cable 46 supplies to camera 18 power from a supply in cabinet 26. It also conveys digital image data from camera 18 to digital image processor 34. Finally, operator input to CPU 36 may be via a keyboard 48.

Test station 10 operates under control of CPU 36, with very limited input of a test operator as follows: The operator places a card cage 12 containing connector pins to be inspected on platform 11 against jigs 16 and enters via keyboard 48 the identifying code of the particular card cage to be tested. Alternatively, of course, this information could be entered by a bar code reader scanning a bar code on the card cage. Under control of CPU 36 using pre-stored information specific to the card cage type identified by its code, robotic positioner 22 moves camera 18 to a predetermined first test position. Camera 18 produces image information of a first portion of the card cage and directs it to image processor 34, which then feeds it to test image monitor 42 so that the operator can verify that the position and alignment of the camera are proper to start the test. Either upon a timed start without operator interference, or upon an operator signal input via keyboard 48, one complete frame of the image is stored, enhanced, binarized, and blob analyzed by image processor 34. CPU 36, comparing the blob analysis results against predetermined criteria, decides which pins have failed, and which are borderline suspect. It may identify such pins by surrounding them with circles or squares, respectively, on test image monitor 42 and print the specific pin by pin results on CPU monitor 40. This information can also be electronically sent to a central file for later use by repair and quality control personnel. A hard copy of such specific information can be produced on printer 44. As soon as the first image has been so processed, robotic positioner 22 repositions the camera with its attached lens and light source to view an adjacent portion of the card cage. The cycle repeats until the all of the pin shrouds in the card cage have been tested. The operator may then attach the printed copy of the test results to the tested card cage and repeat the process.

The image of connector pins viewed end-on is subject to substantial variation due to variations in such things as spectral reflectivity and color, which have no bearing on their operative usefulness. Similarly, the image of the background between pins can vary substantially because of minute machining ridges or discolorations. It is very advantageous, therefore, to optimize the image before computer analysis is initiated. In addition to choice of camera, image optimization involves a combination of lens system, light source and filters. A significant consideration in choosing a lens system is that the overall magnification must produce objects to be analyzed, i.e. pin images, large enough that the smallest objectionable amount of bend can be resolved, and at the same time small enough that the field of view takes in a sufficient area of the pin field. Another consideration is that normal lenses, with aperture stops located just in front of the lens, tend to distort three dimensional objects so that the outer edges of the image appear to be tilting away from the center. The shorter the depth of field of the lens, the more pronounced this effect becomes. A telocentric lens system, with the aperture stop effectively located at the focal point, significantly reduces this effect. The light source should sufficiently and uniformly illuminate the area under test without causing shadows, and, of course, not interfere with the camera view. The filters should maximize the contrast between the pins and the mounting surface between them.

Obviously, with so many interacting variables, persons with skill in the photographic arts could devise many satisfactory combinations. I have found the following combination to reliably detect pins bent 0.020 inches off center from a 0.100 inch grid, while testing half of a pin shroud containing four rows of 32 pins each, viewed from about eleven inches away:

Camera: Hitachi model KP-M1U with ⅔ inch format.

Lens: Telocentric gauging lens system, including 59LGH431 attachment lens and 59LGA450 base lens from Melles Griot, Inc., Rochester, N.Y.

Light source: Dolan-Jenner model 180, 150 watt illuminator with quartz halogen bulb, and Maxi-Ring Lite from Dolan-Jenner Industries, Inc., Woburn, Mass. The Maxi-Ring Lite is a fiber optic bundle that encircles the lens.

Figure 2:
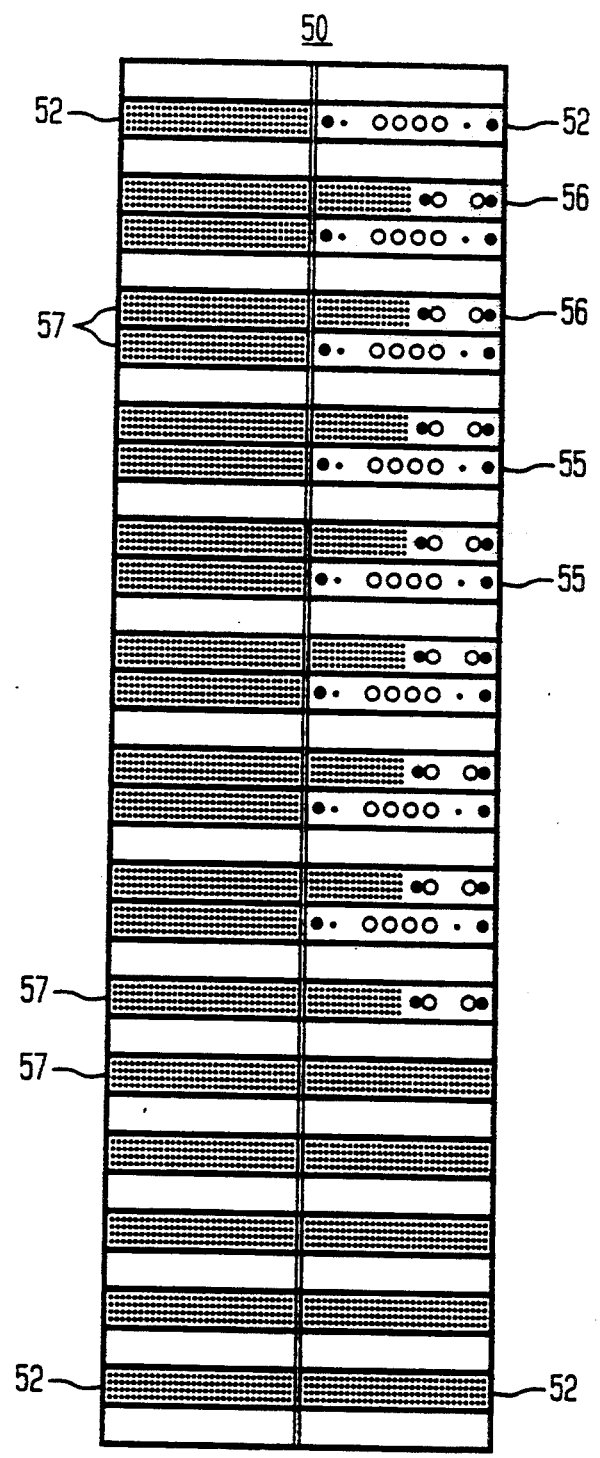
FIG. 2 is a layout of connector pins in shrouds for testing.

For filters, since digital image processing is part of the equipment of the test system of FIG. 1, it is convenient to use digital filtering. An example of the layout of a card cage that may be tested by the apparatus of FIG. 1 is shown in FIG. 2. Card cage 50 houses forty-two connector shrouds 52, each enclosing a number of connector components. In this example, there are four different type shrouds. A first type 54 may house four rows of thirty-two pins each, for a total of 128 pins. A second type 55 may house rivets, holes and coaxial connectors, but no connector pins. A third type 56 may house rivets and coaxial connectors together with four rows of sixteen pins each. The fourth type shroud 57 looks quite similar to type 54 in the image, but may house, for example two rows of thirty-two pins each and two rows of empty holes. By using a priori knowledge of which type shrouds are located in each position, the system can be more efficient.

The digital processing of the image in order to test the card cage for pin and shroud quality will be explained with reference to the flow chart of FIGS. 3A-3D. The first step in the program, indicated by flow chart box 101, is to initialize the process. This is aided by entering the identification of the card cage to be tested, box 102, which can be by keyboard 48, or, for example, by a bar code reader. The computer then accesses prestored information as to the positions of pin shrouds and the locations of pins within each shroud. Additionally, it causes robotic positioner 22 to place the camera assembly in position to start its first pin testing. A single test position might, for example, cover slightly over one half of a shroud, so that shroud type 56 can be completed in one test cycle, and types 54 and 57 can be completed in two cycles each. Shroud type 55, of course, having no connector pins, would be skipped. In box 103 that follows, the video image from camera 18 is displayed on image monitor 42, together with the inspection boundaries. Any obvious misalignment can be corrected by the test operator. The image is then entered into memory in digital image processor 34, box 105. Digital image filtering can be carried out in several steps shown enclosed within dot-dash box 106.

As a first filtering step, box 107, all pixels outside the inspection boundaries can be raised to maximum brightness, thereby "whiting out" that part of the image. To conserve time, digital image processing is henceforth limited to regions inside the test boundaries, box 108. Histogram equalization, box 109, makes fuller use of the image gray scale, while stretching and binarizing, box 111, enhances contrast to become full black and full white. Since the ends of the pins seen by the camera tend to be dark against a light background, the binarized pixel values may also be inverted in flow chart box 111 to produce white dots on a black background. While the digital processing is just as effective without it, pixel inversion usefully reduces glare from image monitor 42.

The image having been optimized, it is now ready for a process known as "blob analysis", included within a dot-dash box 112. This process starts by associating contiguous "ON", (in this case white) pixels into "blobs" and identifying each blob by a unique number label, box 113. To perform this function, the image processor sweeps each horizontal row of pixels in the image, progressing from top to bottom. Each transition from black to white is given a new number label, and each following contiguous white pixel is identified as belonging to the labelled blob. While sweeping each row, the processor also compares each pixel row with the previously swept row immediately above. When any white pixel is contiguous with a white pixel of the row above, all of the white pixels of its blob are merged into the blob above, and the new identifying number label is canceled.

After blobs of contiguous white pixels have been identified, the following set of descriptive attributes of each blob is calculated, in the step indicated by box 115: $x_{max}$, $x_{min}$, $y_{max}$, $y_{min}$, x dimension ($x_{max}-x_{min}$), y dimension ($y_{max}-y_{min}$), area (total number of pixels), and centroid ($x_{average}$, $y_{average}$). A table of all these values is stored in memory. Depending upon the hardware and software used for blob analysis, the identifying, calculating and tabulating can proceed concurrently. A rectangular boundary box having as corners, $x_{min}$, $y_{min}$; $x_{min}$, $y_{max}$; $x_{max}$, $y_{max}$; and $x_{max}$, $y_{min}$, may be drawn around each blob for display on monitor 42, box 117.

Figure 3A:
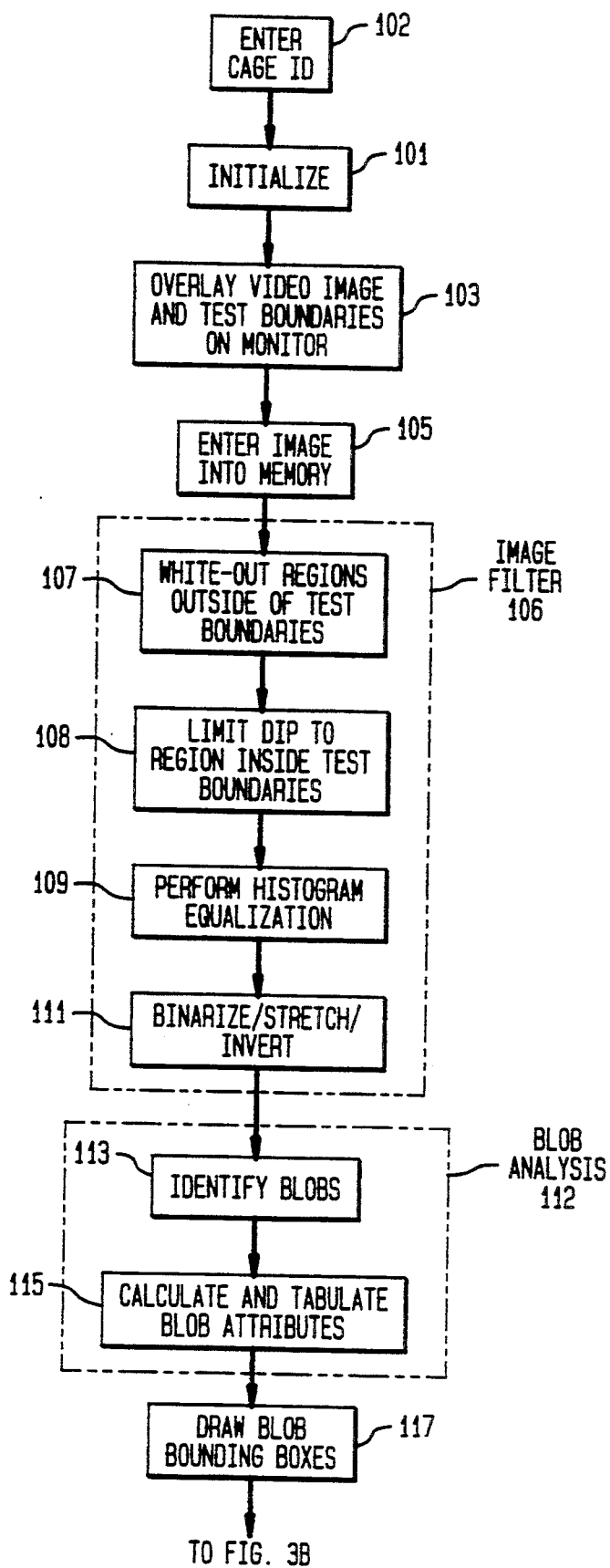
Figure 3B:
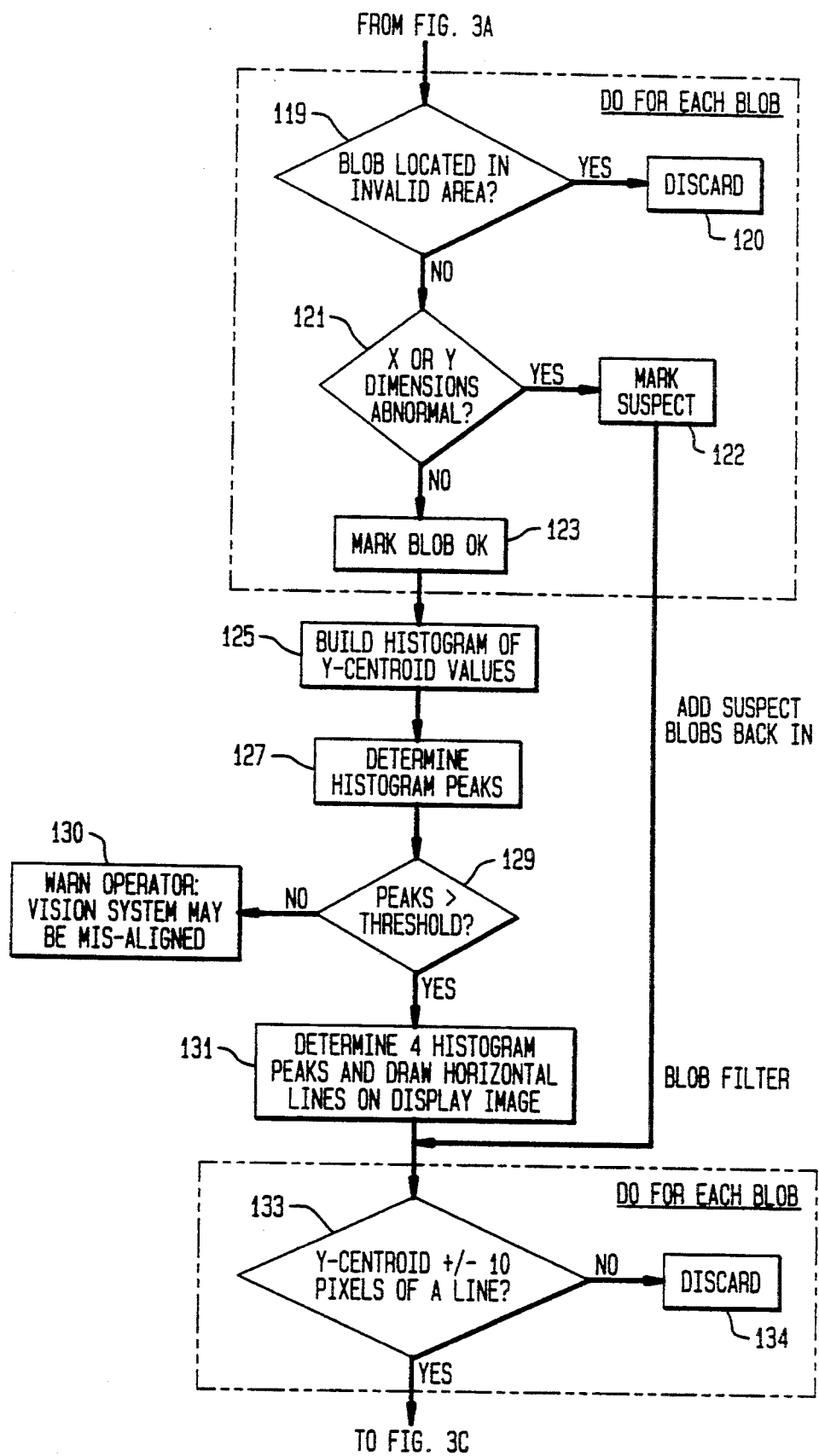

To determine which blobs are most likely to represent pins, the process next proceeds to blob filtering, shown in FIG. 3B enclosed within a dashed box 118. In a first blob filtering step, decision box 119, CPU 36 compares the blob box coordinates with stored information specific to the previously entered card cage type, which identifies areas where connector pins cannot exist. Such areas include, for example, areas adjacent to the test boundaries and areas well outside of where pins are expected, such as areas that contain coaxial connectors. Blobs located in such invalid areas are discarded, box 120.

A second blob filtering step 121 for the remaining blobs compares the blob x and y dimensions against predetermined maximum and minimum limits. Blobs sized outside these limits are considered suspect and temporarily removed from consideration, box 122. Blobs within these limits are marked OK (box 123) and used in the following sequence of steps to determine approximate pin rows. These rows are termed approximate because at this point only horizontal lines, as defined by the video camera sweep, are identified. The actual pin rows may be at a slight angle to the camera sweep lines.

In the step indicated by box 125 a histogram is constructed of the y-coordinates of the centroids of the blobs marked OK. Obviously, the histogram bins should be small enough to clearly separate pin rows from spaces between the rows. In the next step, box 127, to determine a histogram peak, it is useful to select the histogram bin containing the largest number of blobs and the adjacent bin on each side. The total number of blobs in the three bins is then compared against a threshold derived from the number of pins expected in the portion of row under consideration, decision box 129. If the number is too low, there is a high likelihood that the pin rows are aligned too far off horizontal to be reliably identified. A warning to that effect is produced, box 130. The warning may be in the form of an alarm, for example, and printed in text on image monitor 42. If the three bin peak exceeds the threshold, the identified blobs are considered to form a legitimate peak for use in step 131, and removed from further consideration of step 127. Three additional peaks are determined one at a time in the same manner. In step 131 the average y-value of the centroids of the blobs forming each peak becomes the coordinate for the respective approximate pin row. This line may be drawn on display screen 42.

To start the process of determining actual pin rows the blobs marked suspect in step 122 may be added to the population of OK blobs for all further consideration. The next step, decision box 133, is a filtering step to eliminate blobs whose centroids are too far from the previously identified approximate pin row lines (box 134). Continuing to FIG. 3C each remaining blob is assigned to the line it is near, box 135, and, since their identifying numbers are not necessarily in order, the blobs are reordered along their respective rows according to their respective centroid x-coordinates, as indicated by box 137. For worker convenience in identifying individual pins, the blobs may also be renumbered at this time.

In the next step, box 139, again using the individual centroid coordinates of each blob assigned to a row, the slope and y-intercept of each line is determined using the least squares estimation method. To further insure that finally determined pin rows are as accurate as is practicable, in step 141 the average of the slopes found in step 139 is calculated and compared against each individual slope. Since the pin rows are theoretically parallel, if any slope differs from the average beyond a predetermined amount, e.g. ±0.01, the average slope is substituted therefor. A dotted line defining each real pin row, as thus obtained, may be drawn (box 143) on the screen of monitor 42.

The pin rows having been determined to a fair degree of accuracy, and the interpin spacing being known, it is now the task of the computer to evaluate each blob according to its respective quality as a pin. In step 145 each blob within a row is evaluated against each of the criteria listed in Table 1 of FIG. 4. Every listed criterion, however, as applied to the image, does not necessarily of itself indicate whether a pin is defective. As a consequence, the results of step 145 are logically combined in step 147 to allow CPU 36 to make such a determination. Particular combinations of Table 1 criteria failures that have proven with considerable confidence to indicate unacceptable pin conditions are listed in Table 2 of FIG. 4. Similarly, Table 3 lists table 1 results that indicate possible defective pin conditions. To interpret these tables, consider a failure to meet any criterion to produce a "1" for that particular symbol. For example, from Table 1, if a particular blob boundary box fails to intersect its row line, a=1 for that blob. Next consider the logical conditions of Tables 2 and 3 to be those produced by ordinary AND and OR gates. In other words, $1 \cup 1=1$; $1 \cup 0=0$; $1 \cap 1=1$; and $1 \cap 0=1$. If, therefore, the area of a particular blob is less than 65% of its boundary box area, according to Tables 1 and 2 the pin it depicts has failed (b=1 in each case). Similarly, if a blob's x and y dimensions are both too big (c=1, e=1), the pin fails (c $\cup$ e=1). Thus, according to Tables 1 and 3, a single dimension too large (either c=1 or e=1, and all else pass), or a single separation problem (g $\cap$ h $\cap$ r $\cap$ s) does not fail a pin outright, but flags it for a warning.

In Table 1, separation problems listed under symbols g, h, r and s refer to the distance between the centroid of the blob under consideration and that of its neighboring blob in the indicated direction. Both maximum and minimum criteria are applied; they are derived, of course from the known pin spacing.

As indicated by Table 4, characteristics of groups of pins may also be evaluated. A row of pins all bent in the same direction, as caused, for example, by an attempt to insert a non-matching connector, may result in a single separation problem for each of several blobs in a row or column to fail the group. Likewise, a missing pin could be detected by a count of the blobs in the row.

Returning to the flow chart, FIG. 3D, in box 149, the pin test results may be reported to the displays. A circle may be drawn around each failed pin, and a square around each criticized pin on image display 42, and a message relating to failed pin groups may be printed on CPU display 40. In a final reporting step, box 151, the listed pin-by-pin test results can be displayed on monitor 40, printed in hard copy on printer 44 and sent to central files for use in repairing the card cage and gathering quality statistics. Finally, box 153, robotic positioner 22 is signalled to advance in order to test the next half pin shroud, and the process returns (box 155) to the step of box 103 to repeat.

In order to practice the method of the invention, it is not necessary to use separate image processor 34. Software to implement the method as outlined in FIGS. 3A–3D on a general purpose CPU 36 can be generated in any of several appropriate languages by skilled programmers. Enough demand has arisen for digital image processing, however, to cause several suppliers to develop products that can simplify the programming task and speed up the testing process. Data Cube, Inc., of Danvers, Mass., for example, already markets a digital image processing board and software to drive it, known as "Maxvideo 20" and "Sill", respectively, that call up the blob analysis functions directly. The Maxvideo 20 can therefore advantageously be used as image processor 34.

The test apparatus and method described, since it does not rely on human manipulation, vision or judgment, is fast, consistently reliable and inexpensive to operate. The probability of success of the judgment part of the method, outlined by the tables of FIG. 4 can, of course be improved further as more experience is gained with each application of the method. In fact, the use of a neural network, which "learns" by experience, to perform the judgment steps of box 147 could enhance the process. The method can also be further developed, for example by finding vertical pin columns to define a pin grid, and applying appropriate diagonal spacing as well as horizontal and vertical spacing criteria.

Because the method does not rely on exact alignment of the pin rows with the image pixel rows, it is very robust. It could be implemented, for example, by a portable test set carried on a cart to test back plane pins mounted on frames in users premises, such as a telephone company central office. For this purpose, the camera and light assembly could be hand held by the operator, much like a flashlight. Satisfactory alignment by the operator to produce a usable image would be enabled by visual feedback to the operator from the image on display 42.

I have thus described apparatus and a method applicable to testing pins enclosed within shrouds mounted inside card cages that is automated, fast and effective. Furthermore, it does not rely on precise alignment of an image with a reference image. Since the method is visual, rather than electrically conductive, it is not necessarily limited to testing connector pins, but may be applied to test other pin-like items that project in regular rows from a mounting surface.

Still other variations and additions to the apparatus and method of the invention can be devised by those skilled in the art without departing from the spirit and scope of the invention, as defined by the claims that follow.

I claim:

1. A method for testing connectors located in equipment and containing arrays of pins to identify individual unsatisfactory pins, the pins in said arrays arranged in rows and projecting from a mounting surface, said method comprising the steps of:

illuminating said pins and said mounting surface in a manner to avoid projecting pin shadows on said mounting surface;

producing and displaying on a display device an image of at least a portion of said mounting surface and said pin rows viewed from a direction approximately parallel to said pins;

entering into memory a binary version of said image comprising a matrix of pixels in horizontal rows and vertical columns;

associating contiguous pixels of one of the two binary brightness values in said binary image into identified blobs;

computing for each said identified blob a predetermined set of descriptive blob attributes, including the blob dimensions and the location of the blob center;

selecting a first group of blobs consisting of the blobs remaining after excluding the blobs whose centers are located in regions of the image that depict regions of the connector under test which do not contain pin arrays;

selecting a second group of blobs consisting of the blobs in said first group whose dimensions are within a predetermined blob dimension range;

generating a histogram of the locations of the centers of the blobs in said second group by horizontal pixel row;

identifying for each histogram peak that exceeds a predetermined number of blob center locations, the respective horizontal pixel row that bisects it;

for each of said identified peak-bisecting horizontal pixel rows, assigning the blobs in said first group whose centers lie within a predetermined distance of the peak-bisecting pixel row to a respective pin blob row, and identifying the blobs so assigned as pin blobs, each corresponding to a pin;

defining for each pin blob row a centerline that is the straight line that passes closest to the centers of the pin blobs assigned to the respective pin blob row, and overlaying said defined pin blob row centerlines on the image displayed on said display device;

calculating the spacings between pin blobs and their respective row centerlines and between adjacent pin blobs;

applying predetermined criteria to said calculated spacings and to the computed blob attributes of said pin blobs to identify corresponding unsatisfactory pins; and displaying a notation of said identified unsatisfactory pins on said display device.

2. A method as in claim 1, wherein the blob centroid is considered the blob center.

3. A method as in claim 1, wherein the step of defining a pin blob row centerline for each pin blob row is performed using the least squares estimation method.

4. A method as in claim 3, further comprising, after the step of defining a pin blob row centerline for each pin blob row, the steps of:

calculating the slope and Y-intercept of each respective pin blob row centerline;

determining the average slope of the calculated slopes; and substituting the average slope for each calculated slope that differs from the average slope by more than a predetermined amount.

5. A method as in claim 1, wherein said predetermined set of descriptive blob attributes includes the blob area and the area and outline of the blob box bounded by the pixel rows and columns that form the outer blob boundaries; and, in the step of applying predetermined criteria, those pins, the ratio of whose corresponding blob box area to blob area exceeds a predetermined maximum ratio, are identified as unsatisfactory.

6. A method as in claim 5, wherein, in the step of applying predetermined criteria, those pins whose corresponding blob boxes are not intersected by their respective blob row centerlines are identified as unsatisfactory., 7. A method as in claim 1, wherein, in the step of applying predetermined criteria, when the attributes and spacings of a pin blob fail to meet a selected plurality of a selected subset of said predetermined criteria, its corresponding pin is identified as unsatisfactory.

8. A method as in claim 7, wherein said step of displaying a notation of identified unsatisfactory pins comprises surrounding in said displayed image, pin blobs whose attributes and spacings fail to meet at least one but less than said selected plurality of said selected subset of criteria by respective rectangular boxes, and surrounding pin blobs whose corresponding pins are identified as unsatisfactory by respective circles.

9. Apparatus for testing connectors containing arrays of pins to identify individual unsatisfactory pins, said pins arranged in rows and projecting outward from a mounting surface, said apparatus comprising:

illuminating means for illuminating said pins and said mounting surface in a manner to avoid projecting pin shadows on said mounting surface;

camera means for producing a digital image of said pins and said mounting surface, said digital image comprising a matrix of pixels in horizontal rows and vertical columns;

binarizing means for driving each of the pixels of said digital image to either of two brightness values, black or white, respectively;

memory means for temporarily storing the binarized image;

display means for displaying said binarized image;

blob analysis means for associating contiguous pixels of one of said brightness values in said binarized image into identified blobs, and computing for each identified blob a predetermined set of respective descriptive attributes, including the blob dimensions and the location of the blob center;

approximate pin row identifying means for identifying as approximate pin rows the respective horizontal pixel rows around which blob centers are locally clustered;

pin blob selecting and assigning means for selecting as pin blobs, each representative of a pin, and for assigning to an individual pin blob row those blobs whose centers lie within a predetermined distance of each of said respective identified approximate pin rows;

pin blob row centerline defining means for defining for each respective pin blob row its straight row centerline;

calculating means for calculating the spacings between pin blobs and their respective pin blob row centerlines and between adjacent pin blobs;

pin blob testing means for applying predetermined criteria to said spacings and the blob attributes of said pin blobs to identify unsatisfactory pins; and control means for controlling said binarizing means memory means, display means, blob analysis means, approximate pin row identifying means, pin blob selecting and assigning means, pin blob row centerline defining means, calculating means and blob testing means.

10. Apparatus as in claim 9, wherein said camera means comprises a telocentric lens.

11. Apparatus as in claim 10, wherein said illuminating means comprises annular light output means for emitting a ring of light concentric with said telocentric lens means.

12. Apparatus as in claim 11, wherein said illuminating means further comprises a light source and fiber optic light conducting means for conducting light from said light source to said annular light output means.

13. Apparatus as in claim 9, further comprising input means for entering predetermined information specific to said pin row arrangement.

14. Apparatus as in claim 9, further comprising robotic positioning means for positioning said camera means to view a predetermined portion of said arranged pins and said mounting surface in response to said entered pin row arrangement information and said control means.

* * * * *